United States Patent
Li et al.

(10) Patent No.: US 10,831,969 B2
(45) Date of Patent: Nov. 10, 2020

(54) PREDICTING ROUTABILITY OF INTERCONNECTS

(71) Applicant: International Business Machines Corporation, Armonk, NY (US)

(72) Inventors: Zhichao Li, Austin, TX (US); Yaoguang Wei, Austin, TX (US); Kai Liu, Maiden, MA (US); Manjunath Ravi, Austin, TX (US); Su Liu, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/275,263

(22) Filed: Feb. 13, 2019

(65) Prior Publication Data

US 2020/0257770 A1  Aug. 13, 2020

(51) Int. Cl.
*G06F 30/394* (2020.01)
*G06F 30/392* (2020.01)
(Continued)

(52) U.S. Cl.
CPC .......... *G06F 30/394* (2020.01); *G06F 30/367* (2020.01); *G06F 30/39* (2020.01);
(Continued)

(58) Field of Classification Search
CPC ...... G06F 30/398; G06F 30/394; G06F 30/39; G06F 30/367; G06F 30/392; G06F 30/30
See application file for complete search history.

(56) References Cited

U.S. PATENT DOCUMENTS

| | | | | |
|---|---|---|---|---|
| 5,311,443 A | * | 5/1994 | Crain ................... | G06F 30/392 716/122 |
| 5,495,419 A | * | 2/1996 | Rostoker ............... | G06F 30/392 700/121 |

(Continued)

OTHER PUBLICATIONS

Huang et al.; "NTUplace4dr: A Detailed-Routing-Driven Placer for Mixed-Size Circuit Designs With Technology and Region Constraints"; IEEE Transactions on Computer-Aided Design of Integrated Circuits and Systems; vol. 37; Issue: 3 ; Journal Article; Publisher: IEEE (Year: 2018).*

(Continued)

*Primary Examiner* — Helen Rossoshek
(74) *Attorney, Agent, or Firm* — Martin & Associates, LLC; Derek P. Martin (57) ABSTRACT

An integrated circuit physical design tool includes an interconnection congestion predictor that generates a congestion table for an integrated circuit design. Interconnection congestion hotspots are identified based on the congestion table. The proximity of interconnection congestion hotspots to each other is determined, and penalization values are computed based on the proximity of interconnection congestion hotspots to each other. The congestion table is then updated to reflect the penalization values due to proximity of interconnection congestion hotspots. Routability of the interconnection congestion hotspots is then predicted based on the updated congestion table. The updated congestion table may also be used by multiple physical design optimization tools, including placement, global routing, and detail routing.

20 Claims, 9 Drawing Sheets

| Congestion Table | | | | | |
|---|---|---|---|---|---|
| Layers | ACE4 | ACE0.5 | ACE1 | ACE2 | ACE5 |
| ALL | 85.73 | 89.79 | 87.40 | 84.68 | 81.05 |
| HOR | 84.40 | 88.80 | 85.99 | 83.24 | 79.56 |
| VER | 85.73 | 89.79 | 87.40 | 84.68 | 81.05 |
| M2 | 27.29 | 33.03 | 28.94 | 25.64 | 21.56 |
| M3 | 61.73 | 73.82 | 68.33 | 59.57 | 45.19 |
| C4 | 61.24 | 69.33 | 64.29 | 59.29 | 52.06 |
| C5 | 81.89 | 85.75 | 84.62 | 82.65 | 74.52 |
| K1 | 78.41 | 91.14 | 84.78 | 75.86 | 61.85 |
| K2 | 78.29 | 86.93 | 83.60 | 78.44 | 64.18 |
| K3 | 77.23 | 85.64 | 82.04 | 76.54 | 64.69 |
| K4 | 78.53 | 84.62 | 82.48 | 78.65 | 68.36 |
| E1 | 85.42 | 89.22 | 87.32 | 84.69 | 80.44 |
| E2 | 85.73 | 89.53 | 87.28 | 85.07 | 81.05 |
| H1 | 84.54 | 88.63 | 85.72 | 83.42 | 80.40 |
| H2 | 86.36 | 90.41 | 88.23 | 85.09 | 81.69 |
| H3 | 83.47 | 87.89 | 84.76 | 82.23 | 79.01 |
| H4 | 85.85 | 89.26 | 88.07 | 84.91 | 81.15 |

ACE4: Weighted ACE metric, computed as average of four ACE values shown
ACExx: Average congestion on worst xx percent of wiring area Convention: >0.93 predict unrouteable; 0.91 to 0.93 hard to route; <0.91 sufficient resources, predict routable (51) Int. Cl.
    *G06F 30/367*     (2020.01)
    *G06F 30/39*     (2020.01)
    *G06F 30/30*     (2020.01)
    *G06F 30/398*     (2020.01)

(52) U.S. Cl.
    CPC ............ *G06F 30/392* (2020.01); *G06F 30/30* (2020.01); *G06F 30/398* (2020.01)

(56) References Cited

U.S. PATENT DOCUMENTS

| | | | |
|---|---|---|---|
| 5,644,500 A | 7/1997 | Miura et al. | |
| 5,737,236 A * | 4/1998 | Maziasz | G06F 30/39 716/123 |
| 5,815,403 A * | 9/1998 | Jones | G06F 30/392 716/119 |
| 5,856,927 A | 1/1999 | Greidinger et al. | |
| 6,282,693 B1 * | 8/2001 | Naylor | G06F 30/392 716/114 |
| 6,477,688 B1 * | 11/2002 | Wallace | G06F 30/327 716/107 |
| 6,480,991 B1 * | 11/2002 | Cho | G06F 30/392 716/122 |
| 6,529,042 B1 * | 3/2003 | Hiramoto | H03K 19/0016 326/121 |
| 6,557,145 B2 * | 4/2003 | Boyle | G06F 30/39 716/105 |
| 6,738,960 B2 * | 5/2004 | Teig | G06F 30/394 716/113 |
| 6,958,545 B2 * | 10/2005 | Kotecha | G06F 30/394 257/758 |
| 7,251,800 B2 | 7/2007 | McElvain et al. | |
| 7,275,230 B2 * | 9/2007 | Gentry | G06F 30/392 716/139 |
| 7,921,391 B2 * | 4/2011 | Weis | G06F 30/39 716/110 |
| 7,921,393 B2 * | 4/2011 | Furnish | G06F 30/394 716/110 |
| 8,239,807 B2 * | 8/2012 | Arora | G06F 30/394 716/126 |
| 8,397,184 B2 * | 3/2013 | Schultz | G06F 30/39 716/100 |
| 8,839,171 B1 * | 9/2014 | Varadarajan | G06F 30/30 716/113 |
| 9,384,316 B2 * | 7/2016 | Folberth | G06F 30/394 |
| 10,445,457 B1 * | 10/2019 | Loo | G06F 30/367 |
| 10,452,807 B1 * | 10/2019 | Sharma | G06F 30/392 |
| 2007/0079266 A1 * | 4/2007 | Devineni | G06F 30/398 716/112 |
| 2015/0379181 A1 | 12/2015 | Macdonald et al. | |
| 2016/0103941 A1 | 4/2016 | Tai | |
| 2016/0378902 A1 | 12/2016 | Graur et al. | |
| 2017/0286585 A1 | 10/2017 | Sridhar et al. | |

OTHER PUBLICATIONS

Yang et al.; "Layout Hotspot Detection With Feature Tensor Generation and Deep Biased Learning"; IEEE Transactions on Computer-Aided Design of Integrated Circuits and Systems; vol. 38; Issue: 6; Journal Article; Publisher: IEEE (Year: 2019).*

Wei et al., "Techniques for Scalable and Effective Routability Evaluation", ACM Transactions on Design Automation of Electronic Systems, vol. 19, No. 2, Article 17, Mar. 2014.

Saeedi et al., "An Efficient Congestion Reduction Algorithm Based on Contour Plotting", International Conference on Microelectronics, 2005.

* cited by examiner

| Congestion Table | | | | | |
|---|---|---|---|---|---|
| Layers | ACE4 | ACE0.5 | ACE1 | ACE2 | ACE5 |
| ALL | 85.73 | 89.79 | 87.40 | 84.68 | 81.05 |
| HOR | 84.40 | 88.80 | 85.99 | 83.24 | 79.56 |
| VER | 85.73 | 89.79 | 87.40 | 84.68 | 81.05 |
| M2 | 27.29 | 33.03 | 28.94 | 25.64 | 21.56 |
| M3 | 61.73 | 73.82 | 68.33 | 59.57 | 45.19 |
| C4 | 61.24 | 69.33 | 64.29 | 59.29 | 52.06 |
| C5 | 81.89 | 85.75 | 84.62 | 82.65 | 74.52 |
| K1 | 78.41 | 91.14 | 84.78 | 75.86 | 61.85 |
| K2 | 78.29 | 86.93 | 83.60 | 78.44 | 64.18 |
| K3 | 77.23 | 85.64 | 82.04 | 76.54 | 64.69 |
| K4 | 78.53 | 84.62 | 82.48 | 78.65 | 68.36 |
| E1 | 85.42 | 89.22 | 87.32 | 84.69 | 80.44 |
| E2 | 85.73 | 89.53 | 87.28 | 85.07 | 81.05 |
| H1 | 84.54 | 88.63 | 85.72 | 83.42 | 80.40 |
| H2 | 86.36 | 90.41 | 88.23 | 85.09 | 81.69 |
| H3 | 83.47 | 87.89 | 84.76 | 82.23 | 79.01 |
| H4 | 85.85 | 89.26 | 88.07 | 84.91 | 81.15 |

ACE4: Weighted ACE metric, computed as average of four ACE values shown

ACExx: Average congestion on worst xx percent of wiring area

Convention: >0.93 predict unrouteable; 0.91 to 0.93 hard to route; <0.91 sufficient resources, predict routable

PREDICTING ROUTABILITY OF INTERCONNECTS

BACKGROUND

1. Technical Field

This disclosure generally relates to integrated circuits, and more specifically relates to physical design and fabrication of integrated circuits.

2. Background Art

Integrated circuit design tools continue to evolve and become more powerful. An integrated circuit design typically starts with a logic design stage, followed by a physical design stage that transforms the logic design into physical components and interconnections. Once an integrated circuit physical design is complete, the integrated circuit can be fabricated.

Both logical design and physical design of an integrated circuit are typically performed in an iterative fashion, iterating in the logic design stage until the logic design has the desired performance characteristics, and iterating in the physical design stage until the desired performance characteristics in the logic design are realized in the physical design with a given layout of components and interconnections. As the density of components and interconnections increases, the routing of interconnections becomes more challenging due to areas of the integrated circuit that are congested and thereby constrain placement of interconnections and/or components. There are known tools for predicting routability of interconnection congestion hotspots (i.e., areas of significant interconnection congestion) in the physical design of an integrated circuit before actual routing is performed. However, these tools are deficient because they do not provide accurate predictions in certain circumstances. As a result, a design that was predicted to be routable by known tools can sometimes be unroutable.

BRIEF SUMMARY

An integrated circuit physical design tool includes an interconnection congestion predictor that generates a congestion table for an integrated circuit design. Interconnection congestion hotspots are identified based on the congestion table. The proximity of interconnection congestion hotspots to each other is determined, and penalization values are computed based on the proximity of interconnection congestion hotspots to each other. The congestion table is then updated to reflect the penalization values due to proximity of interconnection congestion hotspots. Routability of the interconnection congestion hotspots is then predicted based on the updated congestion table. The updated congestion table may also be used by multiple physical design optimization tools, including placement, global routing, and detail routing.

The foregoing and other features and advantages will be apparent from the following more particular description, as illustrated in the accompanying drawings.

BRIEF DESCRIPTION OF THE SEVERAL VIEWS OF THE DRAWING(S)

The disclosure will be described in conjunction with the appended drawings, where like designations denote like elements, and.

DETAILED DESCRIPTION

Figure 1:
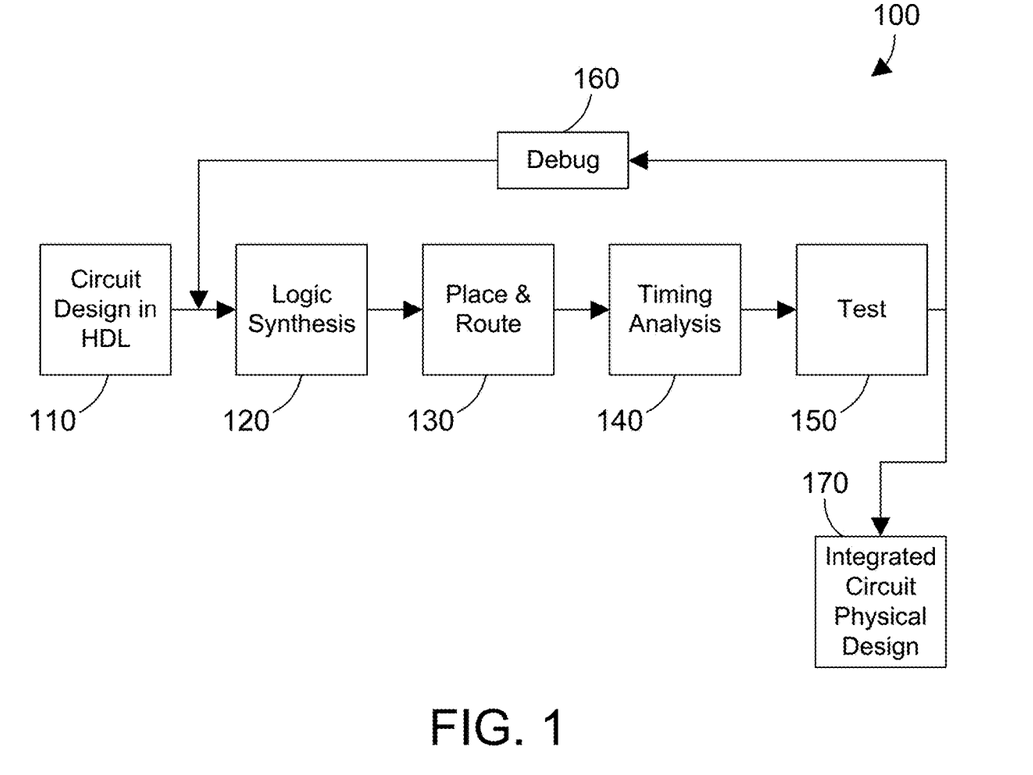
FIG. 1 is a block diagram showing steps in an iterative design process for generating an integrated circuit physical design.

An extremely simplified block diagram is shown in FIG. 1 to illustrate some steps in a process 100 for generating a physical design of an integrated circuit. Generally the desired function of an integrated circuit is represented in a logical form, such as a hardware description language (HDL). The logic design stage of the integrated circuit design typically includes many iterative steps to achieve the desired function and performance of the integrated circuit design. These steps are not discussed herein. System 100 in FIG. 1 assumes the logic design has been completed, and the logic design is represented in the circuit design in HDL 110. The circuit design in HDL 110 is input into a logic synthesis step 120 that synthesizes the circuit design in HDL 110 into specific hardware components and interconnections. Once the required components and interconnections are determined in the logic synthesis step 120, the components are placed and the interconnections are routed in the place and route step 130. A timing analysis is then performed at step 140 to determine whether the integrated circuit design satisfies desired timing and performance characteristics. A test state 150 provides various functional tests on the integrated circuit design. When there are issues that arise during the timing analysis 140 or the test 150, process 100 loops back to a debug step 160 that identifies problems in the integrated circuit design that need to be fixed. During the debug step 160, designers can move components and manually route connections to address the issues in the integrated circuit design that do not satisfy the timing analysis 140 and test 150 steps. The modified design can then be fed back, with logic synthesis 120, place and route 130, timing analysis 140, and test 150 repeating. This looping to address issues in the integrated circuit physical design can repeat many times, with each iteration reducing the issues that do not satisfy timing or performance characteristics. By repeatedly iterating and addressing the issues in the design, the eventual outcome is an integrated circuit physical design 170 that satisfies all timing and performance characteristics. At this point the integrated circuit design 170 can be used to fabricate an integrated circuit.

During the place and route step 130 in FIG. 1, the components are initially placed in the integrated circuit physical design, and before the interconnections are routed between components, analysis is performed to generate a congestion table that identifies where interconnection congestion hotspots are present, and to predict based on the congestion table the routability of the interconnection congestion hotspots. If there are one or more interconnection congestion hotspots that are predicted to be unroutable, the placement of components can be changed to alleviate the interconnection congestion hotspots. The actual routing of interconnections is a very time-consuming step, so predicting routability of interconnection congestion hotspots is a valuable tool to save time during an integrated circuit physical design stage by identifying potential problem areas using interconnection congestion hotspots, and changing placement of components until the interconnection congestion hotspots are all predicted as routable. Once all interconnection congestion hotspots are predicted as routable, the actual routing of interconnections is performed.

Figure 2:
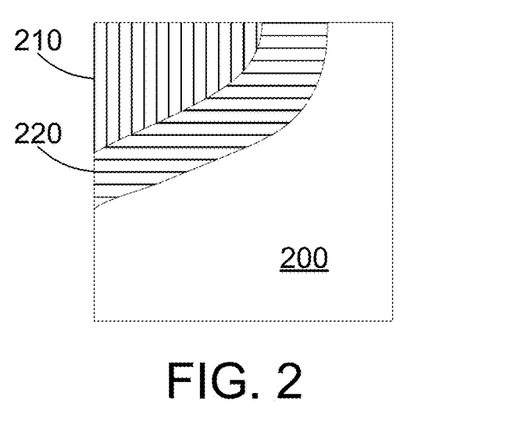
FIG. 2 is a top view of an integrated circuit with layers partially cut away to show vertical and horizontal layers of connections in an integrated circuit.

FIG. 2 shows a top view of an integrated circuit 200 showing cutaway views that illustrate a vertical connection layer 210 and a horizontal connection layer 220. Integrated circuits typically include many layers, and as the density of components increases, there can be many layers of both horizontal and vertical connections as shown in FIG. 2. Interconnections between connection layers are typically made using vias. Thus, an output on a component can be connected to a horizontal conductor in the horizontal layer 220, which can then connect using a via to a vertical conductor in the vertical layer 210, which can then connect to the input of a component. In this manner, one or more horizontal layers of connections and one or more vertical layers of connections as shown in FIG. 2 are commonly used to route interconnections between components in an integrated circuit physical design.

Figure 3:
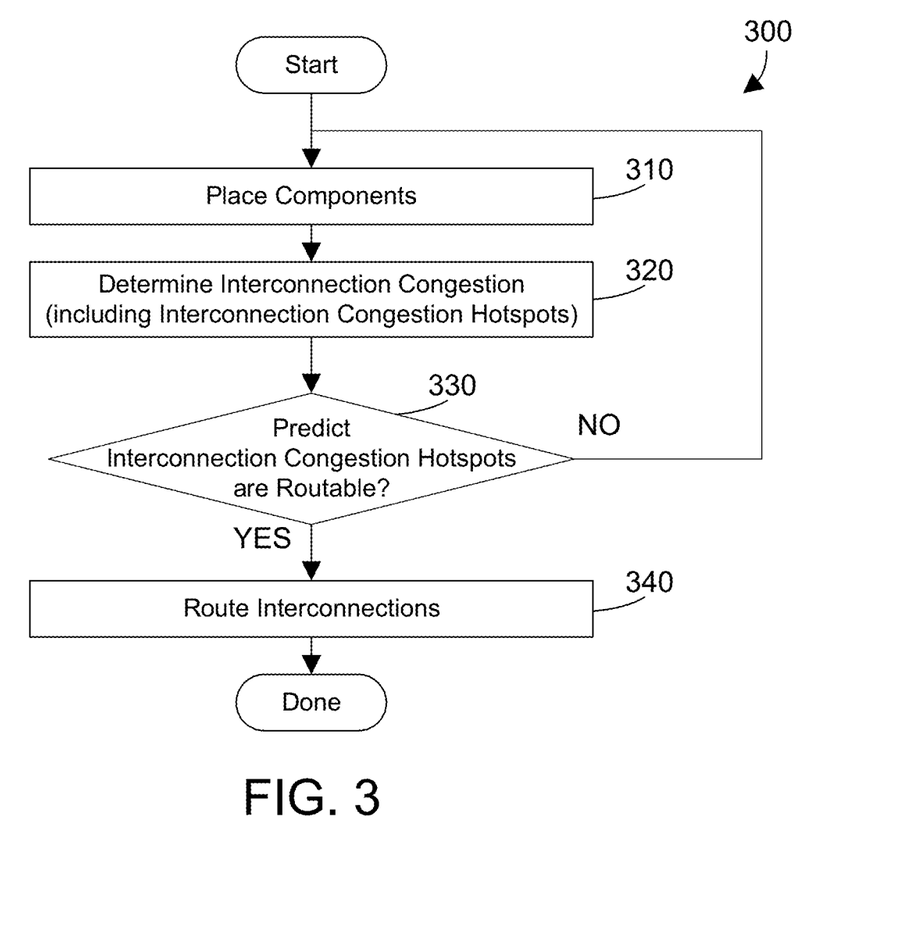
FIG. 3 is a flow diagram of a method for predicting routability of interconnection congestion hotspots.

A method 300 is shown in FIG. 3 as a suitable example of a method that could be performed during the place and route step 130 in FIG. 1. Components are placed (step 310). Interconnection congestion is determined, including interconnection congestion hotspots (step 320). A prediction is made regarding whether the interconnection congestion hotspots are routable (step 330). Note that interconnections that are not in interconnection congestion hotspots are assumed to be routable, so the interconnection congestion hotspots are the limiting factor regarding routability of interconnections in the integrated circuit physical design. When one or more of the interconnection congestion hotspots are not routable (step 330=NO), method 300 loops back to step 310 and continues. When one or more interconnection congestion hotspots are predicted as unroutable, a designer could manually change placement of the components in step 310 in the next iteration, or an automated tool could change placement of the components in step 310 automatically based on the predicted unroutability of the interconnection congestion hotspots. Method 300 preferably iterates in step 310, 320 and 330=NO, with each iteration hopefully improving the predicted routability of one or more interconnection congestion hotspots until step 330 predicts that all interconnection congestion hotspots are routable (step 330=YES). All interconnections are then routed (step 340).

Figure 4:
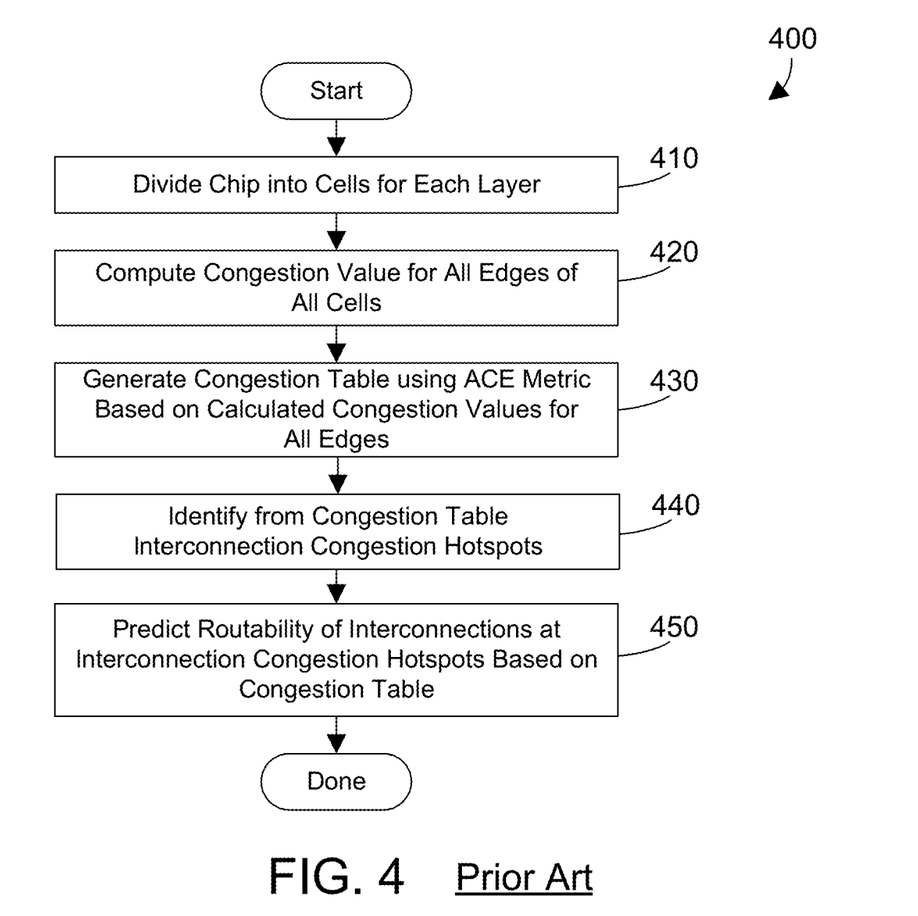
FIG. 4 is a flow diagram of a prior art method for predicting interconnection congestion hotspots.

Referring to FIG. 4, a prior art method 400 illustrates specific steps known in the art for determining interconnection congestion in step 320 in FIG. 3. A chip is divided into cells for each layer (step 410). A congestion value is computed for all edges of all cells (step 420). A congestion table is then generated based on a metric known as ACE, which stands for Average Congestion of the x % most congested Edges, based on the calculated congestion values for all edges (step 430). In the prior art, it is also known to generate a congestion map that allows a designed to visually identify predicted congestion of interconnections using different colors to represent different predicted interconnection concentrations. Interconnection congestion hotspots are then identified from the congestion table (step 440). The routabilty of interconnections at the interconnection congestion hotspots is then predicted based on the congestion table (step 450).

A problem with prior art method 400 is that it can predict that all interconnection hotspots are routable in step 450, when, in fact, they are not. The prediction of routability is an important step before actually routing the interconnections. Let's assume, for example, prior art method 400 predicts all interconnection hotspots are routable in step 450, which results in step 330=YES in FIG. 3. This means interconnections are then routed (step 340). But if the routing of interconnections fails due to excessive interconnections in one or more interconnection congestion hotspots, the time spent routing the interconnections is wasted, because the routing failures will likely lead to a different placement of components, which means the step of routing the interconnections will have to be repeated. This shows the importance of being able to accurately predict routability of interconnections in an integrated circuit design before actually routing the interconnections.

Proximity of two adjacent interconnection congestion hotspots is one factor that can lead to the prior art method 400 producing a false positive that all interconnection congestion hotspots are routable, when, in fact, they are not. The current ACE metric and congestion tables used in the prior art do not account for the proximity of interconnection congestion hotspots. When two interconnection congestion hotspots are next to each other, the area between them can become unroutable, even when the ACE metric produces values that predict they should be routable. The disclosure and claims herein provide an improved prediction for routability of interconnection congestion hotspots by computing a penalty value based on proximity between interconnection congestion hotspots, then modifying the ACE values using the penalty values to produce a more accurate prediction of whether or not interconnection congestion hotspots will be routable or not.

An integrated circuit physical design tool includes an interconnection congestion predictor that generates a congestion table for an integrated circuit design. Interconnection congestion hotspots are identified based on the congestion table. The proximity of interconnection congestion hotspots to each other is determined, and penalization values are computed based on the proximity of interconnection congestion hotspots to each other. The congestion table is then updated to reflect the penalization values due to proximity of interconnection congestion hotspots. Routability of the interconnection congestion hotspots is then predicted based on the updated congestion table. The updated congestion table may also be used by multiple physical design optimization tools, including placement, global routing, and detail routing.

Figure 5:
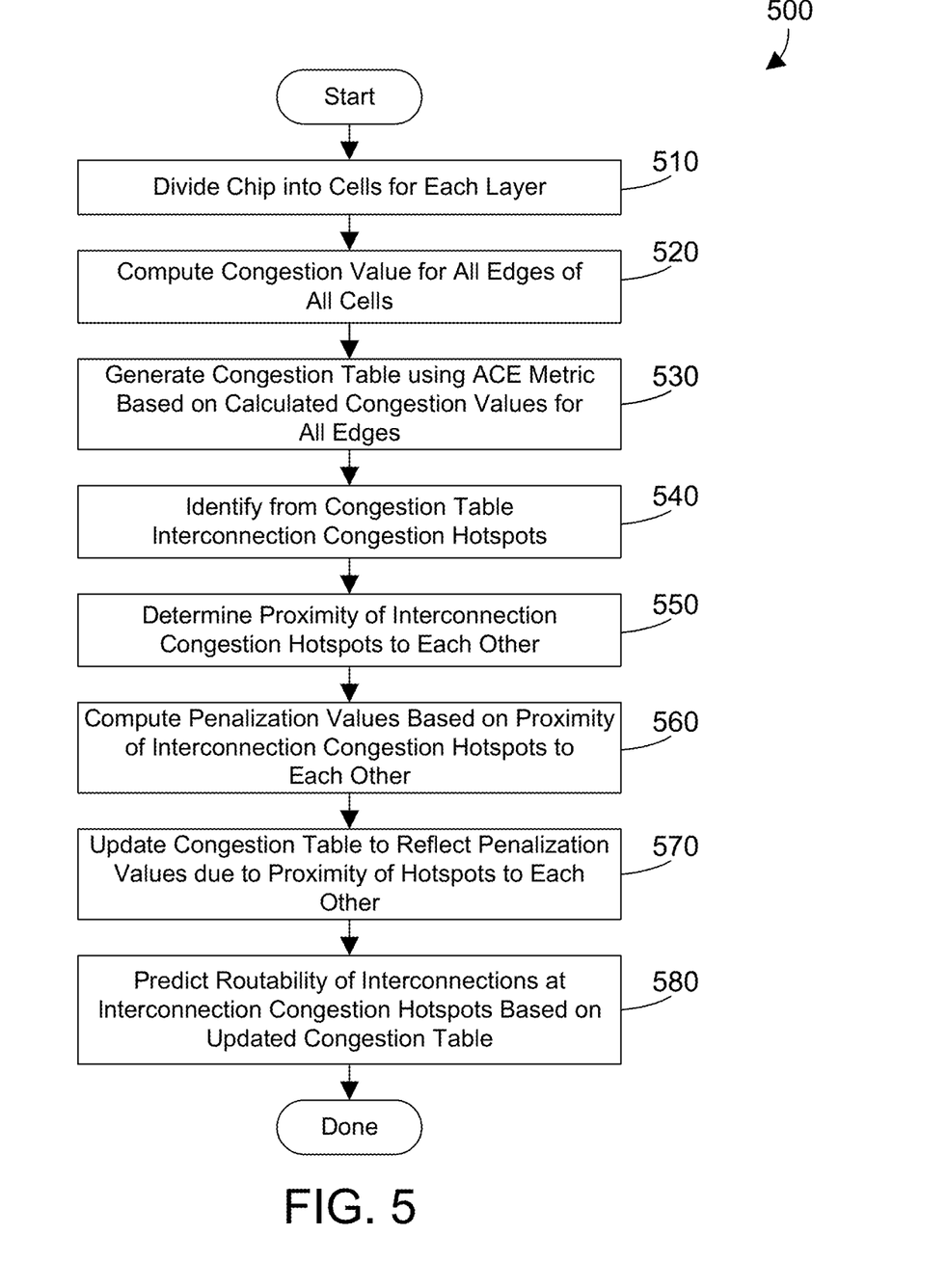
FIG. 5 is a flow diagram of a method for predicting routability of interconnection congestion hotspots based on proximity of the hotspots to each other.

Referring to FIG. 5, a method 500 in accordance with the disclosure and claims herein represents one suitable implementation for step 320 in FIG. 3 in accordance with the preferred embodiments. The chip is divided into cells for each layer (step 510). Congestion values are computed for all edges of all cells (step 520). A congestion table is generated using the ACE metric based on the calculated congestion values for all edges computed in step 520 (step 530). Interconnection congestion hotspots are identified from the congestion table (step 540). Steps 510, 520, 530 and 540 could be the same as the prior art steps 410, 420, 430 and 440 shown in FIG. 4, or could include other operations that are not known in the prior art. The proximity of interconnection congestion hotspots with respect to each other is determined (step 550). Penalization values are then computed based on the proximity of interconnection congestion hotspots to each other (step 560). The values in the congestion table are then updated to reflect the penalization values due to the proximity of hotspots to each other (step 570). The routability of interconnections at the interconnection congestion hotspots are then predicted based on the updated congestion table (step 580), which include values that were modified using the penalization values to more accurately reflect predicted routability. Method 500 is then done.

Figure 6:
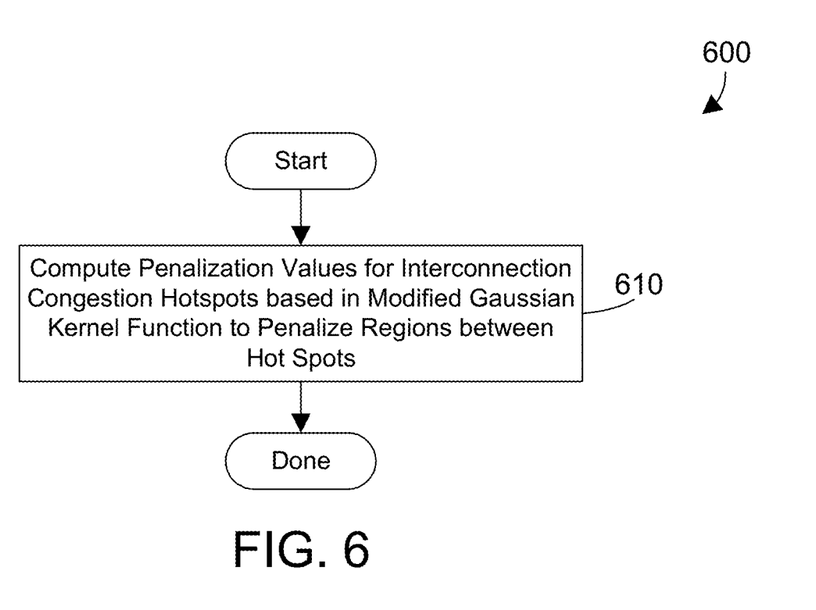
FIG. 6 is a flow diagram of one suitable implementation for step 560 in FIG. 5.

Referring to FIG. 6, a method 600 is one suitable implementation for step 560 in FIG. 5. In method 600, the penalization values for the interconnection congestion hotspots are computed based on a modified Gaussian kernel function to penalize regions between hot spots (step 610). For example, a proximity penalty for two interconnection congestion hotspots can be computed using the following equation:

$$ProximityPenalty = 1 + \beta * e^{\left(-\frac{\sqrt{(y_2-y_1)^2+(x_2-x_1)^2}}{\sqrt{s_1}+\sqrt{s_2}}\right)}$$

where: (x1,y1) are cartesian coordinates for a first interconnection congestion hotspot;
(x2,y2) are cartesian coordinates for a second interconnection congestion hotspot;
S1 is the size of the first interconnection congestion hotspot;
S2 is the size of the second interconnection congestion hotspot; and
β is a tunable value that controls the proximity penalty range.

Note the tunable value β is most preferably in the range of 1.0 to 3.0, and is selected according to the technology used to fabricate the integrated circuit physical design. While specific values of β will be determined based on empirical testing, it is believed that for 20 nanometer or greater technology, a suitable value of β is from 0.3 to 0.5. For 10-14 nanometer technology, a suitable value of β is preferably from 0.8 to 1.0. For less than 7 nanometer technology, a suitable value of β is preferably from 1.0 to 2.0. The penalization values are each greater than or equal to one, and the updating of the values in the congestion table to reflect the plurality of penalization values is done by multiplying each of the computed congestion values for interconnections in the congestion table by a corresponding penalization value.

Figure 7:
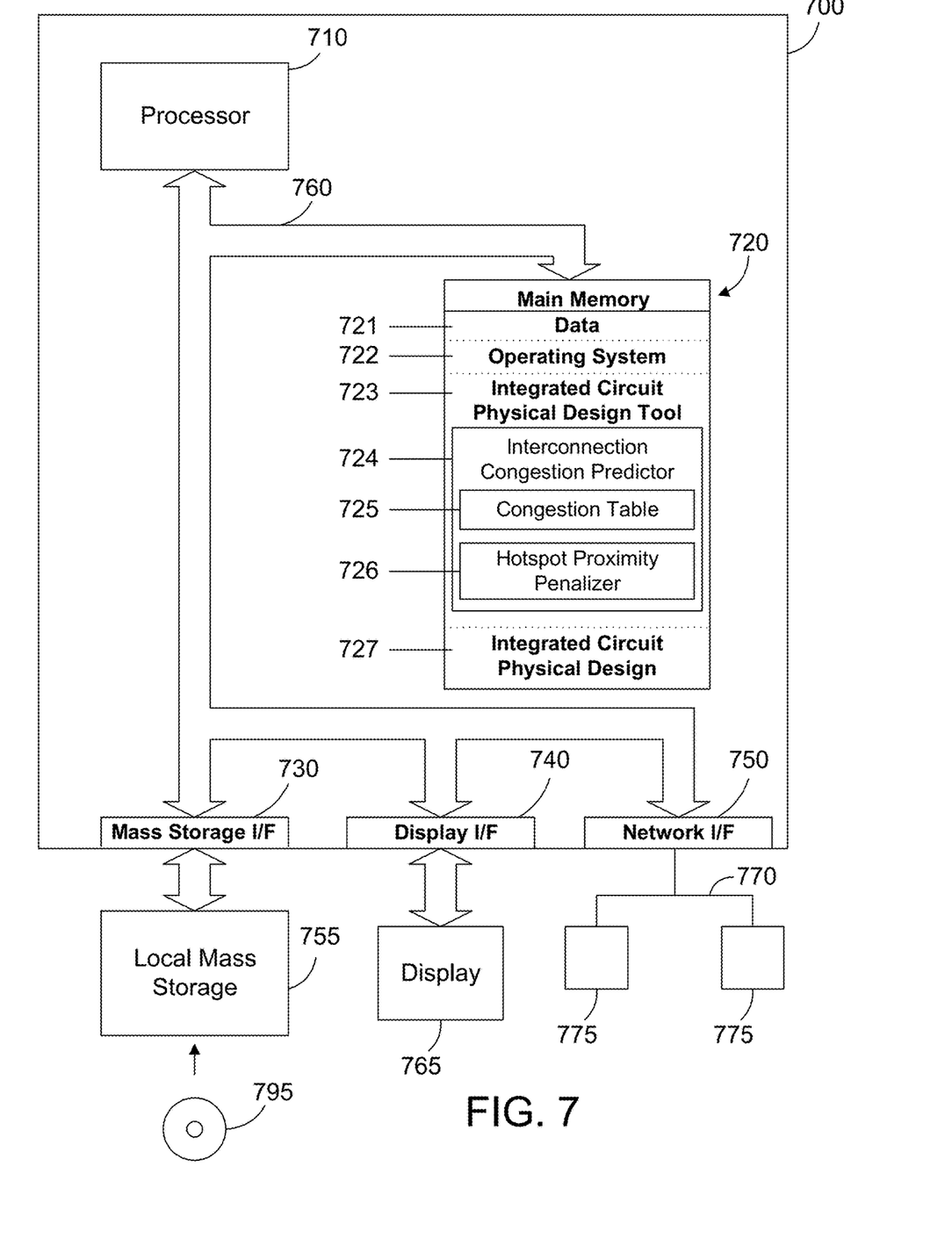
FIG. 7 is a block diagram of a computer system that includes an integrated circuit physical design tool that includes an interconnection congestion predictor that more accurately predicts routability of interconnection congestion hotspots by taking into account the proximity of the hotspots to each other.

Referring to FIG. 7, a computer system 700 is one suitable implementation of a computer system that includes an integrated circuit synthesis tool as described herein. Computer system 700 is an IBM POWERS computer system. However, those skilled in the art will appreciate that the disclosure herein applies equally to any computer system, regardless of whether the computer system is a complicated multi-user computing apparatus, a single user workstation, a laptop computer system, a tablet computer, a phone, or an embedded control system. As shown in FIG. 7, computer system 700 comprises one or more processors 710, a main memory 720, a mass storage interface 730, a display interface 740, and a network interface 750. These system components are interconnected through the use of a system bus 760. Mass storage interface 730 is used to connect mass storage devices, such as local mass storage device 755, to computer system 700. One specific type of local mass storage device 755 is a readable and writable CD-RW drive, which may store data to and read data from a CD-RW 795. Another suitable type of local mass storage device 755 is a card reader that receives a removable memory card, such as an SD card, and performs reads and writes to the removable memory. Yet another suitable type of local mass storage device 755 is universal serial bus (USB) that reads a storage device such as a flash drive.

Main memory 720 preferably contains data 721, an operating system 722, and an integrated circuit physical design tool 723 that generates an integrated circuit physical design 727. Data 721 represents any data that serves as input to or output from any program in computer system 700. Operating system 722 is a multitasking operating system, such as AIX or LINUX. The integrated circuit physical design tool 723 includes an interconnection congestion predictor 724 that predicts routability of interconnections using a congestion table 725 and a hotspot proximity penalizer 726. The hotspot proximity penalizer 726 generates a proximity penalty that is multiplied by the congestion values in the congestion table 725 for two interconnection congestion hotspots that are in proximity to each other, thereby more accurately predicting routability of interconnections near those hotspots that are in proximity to each other. Once the interconnection congestion predictor 724 predicts the interconnections at all interconnection congestion hotspots are routable, the interconnections can be routed, followed by other steps to generate the integrated circuit physical design 727.

The interconnection congestion predictor 724 preferably performs method 500 in FIG. 5, and can also perform method 600 in FIG. 6. The hotspot proximity penalizer 726 preferably performs steps 560 and 570 in FIG. 5 and can also perform step 610 in FIG. 6.

Computer system 700 utilizes well known virtual addressing mechanisms that allow the programs of computer system 700 to behave as if they only have access to a large, contiguous address space instead of access to multiple, smaller storage entities such as main memory 720 and local mass storage device 755. Therefore, while data 721, operating system 722, integrated circuit physical design tool 723, and integrated circuit physical design 727 are shown to reside in main memory 720, those skilled in the art will recognize that these items are not necessarily all completely contained in main memory 720 at the same time. It should also be noted that the term "memory" is used herein generically to refer to the entire virtual memory of computer system 700, and may include the virtual memory of other computer systems coupled to computer system 700.

Processor 710 may be constructed from one or more microprocessors and/or integrated circuits. Processor 710 executes program instructions stored in main memory 720. Main memory 720 stores programs and data that processor 710 may access. When computer system 700 starts up, processor 710 initially executes the program instructions that make up operating system 722. Processor 710 also executes the integrated circuit synthesis physical design tool 723.

Although computer system 700 is shown to contain only a single processor and a single system bus, those skilled in the art will appreciate that an integrated circuit physical design tool as described herein may be practiced using a computer system that has multiple processors and/or multiple buses. In addition, the interfaces that are used preferably each include separate, fully programmed microprocessors that are used to off-load compute-intensive processing from processor 710. However, those skilled in the art will appreciate that these functions may be performed using I/O adapters as well.

Display interface 740 is used to directly connect one or more displays 765 to computer system 700. These displays 765, which may be non-intelligent (i.e., dumb) terminals or fully programmable workstations, are used to provide system administrators and users the ability to communicate with computer system 700. Note, however, that while display interface 740 is provided to support communication with one or more displays 765, computer system 700 does not necessarily require a display 765, because all needed interaction with users and other processes may occur via network interface 750.

Network interface 750 is used to connect computer system 700 to other computer systems or workstations 775 via network 770. Computer systems 775 represent computer systems that are connected to the computer system 700 via the network interface. Network interface 750 broadly represents any suitable way to interconnect electronic devices, regardless of whether the network 770 comprises present-day analog and/or digital techniques or via some networking mechanism of the future. Network interface 750 preferably includes a combination of hardware and software that allows communicating on the network 770. Software in the network interface 750 preferably includes a communication manager that manages communication with other computer systems 775 via network 770 using a suitable network protocol. Many different network protocols can be used to implement a network. These protocols are specialized computer programs that allow computers to communicate across a network. TCP/IP (Transmission Control Protocol/Internet Protocol) is an example of a suitable network protocol that may be used by the communication manager within the network interface 750. In one suitable implementation, the network interface 750 is a physical Ethernet adapter.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 8:
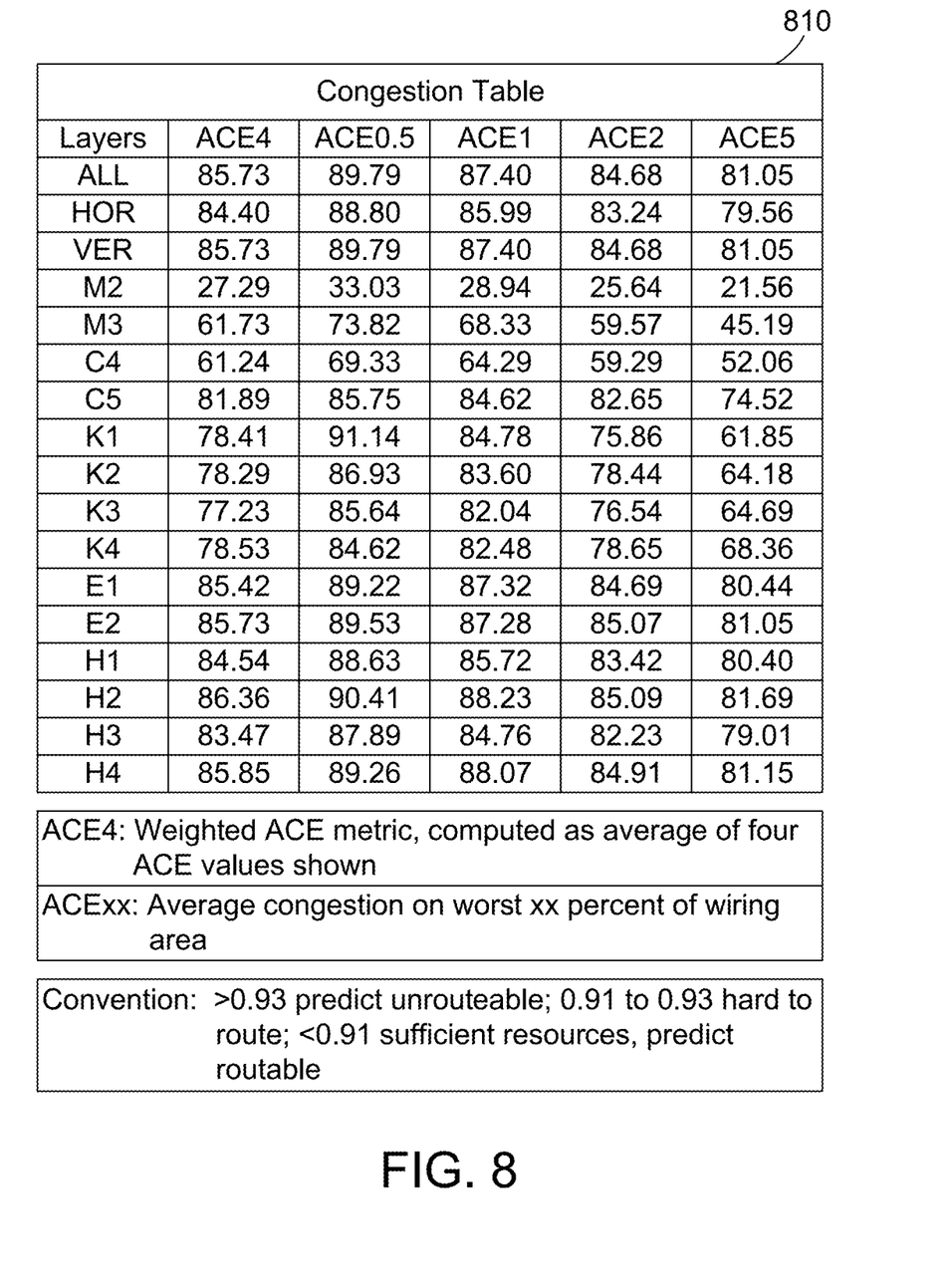
FIG. 8 is a block diagram of a sample congestion table with sample values that can be used to predict congestion hotspots and their routability.

A simple example is now given to illustrate some of the features and steps described above. FIG. 8 shows a sample congestion table 810, which is one suitable example for the congestion table 725 shown in FIG. 7. The congestion table 810 is most preferably a congestion table that is generated using steps 410, 420 and 430 in the prior art method 400 shown in FIG. 4. The congestion table 810 includes columns for layers, ACE4, ACE0.5, ACE1, ACE2 and ACE5. The layers in the layer column include ALL, HOR (for Horizontal), VER (for Vertical) M2, M3, C4, C5, K1, K2, K3, K4, E1, E2, H1, H2, H3 and H4. We assume for this example the horizontal layers in the integrated circuit design are every other one in the layer list starting with M2, namely: M2, C4, K1, K3, E1, H1 and H3. Each of these horizontal layers include conductors in a horizontal direction, such as layer 220 shown in FIG. 2. We also assume the vertical layers in the integrated circuit design are every other one in the layer list starting with M3, namely: M3, C5, K2, K4, E2, H2 and H4. Each of these vertical layers include conductors in a vertical direction, such as layer 210 shown in FIG. 2. The HOR value is the computed average of the horizontal layer values listed above, while the VER value is the computed average of the vertical layer values listed above. The ALL value is the average of the HOR and VER values. This example assumes four ACE metrics are used, ACE0.5, ACE1, ACE2 and ACE5. ACE0.5 shows the average congestion on the worst 0.5% of wiring area. ACE1 shows the average congestion on the worst 1% of wiring area. ACE2 shows the average congestion on the worst 2% of the wiring area. And ACE5 shows the average congestion on the worst 5% of the wiring area. The ACE4 column contains values that are an average of the four ACE columns to the right.

As shown in FIG. 8, the convention for the congestion table 810 is that a value greater than 0.93 results in a prediction of unroutable, a value from 0.91 to 0.93 results in a prediction of hard to route, and a value less than 0.91 results in a prediction of sufficient resources to make it routable. We see the values in the rows ALL, HOR and VER in the ACE4 column are all less than 0.91, resulting a prediction that all interconnection congestion hotspots are routable, such as step 330=YES in FIG. 3. This would result in actually routing the interconnections 340. However, the prediction that all interconnection hotspots are routable can prove to be erroneous when interconnection congestion hotspots occur in close physical proximity to each other. The prior art ACE metrics used in congestion table 810 in FIG. 8 do not account for interconnection congestion hotspots that are in close proximity to each other. The preferred embodiments recognize that proximity of interconnection congestion hotspots can negatively affect the predictability of routability, and compensates by computing proximity penalties for the interconnection congestion hotspots that are used to modify the ACE metric values so the prediction of routability is more accurate than using the prior art ACE metric alone.

Figure 9:
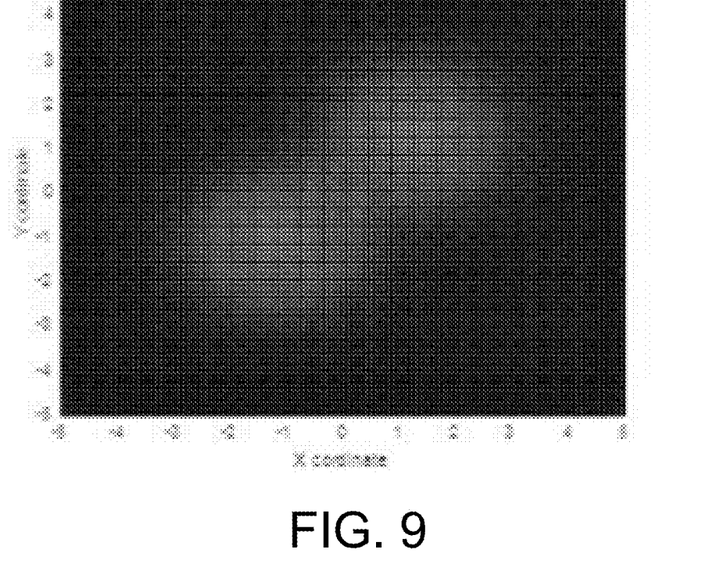
FIG. 9 is a graph representing two adjacent hotspots using a modified Gaussian kernel function to illustrate how two adjacent interconnection hotspots can influence the area between them.
Figure 10:
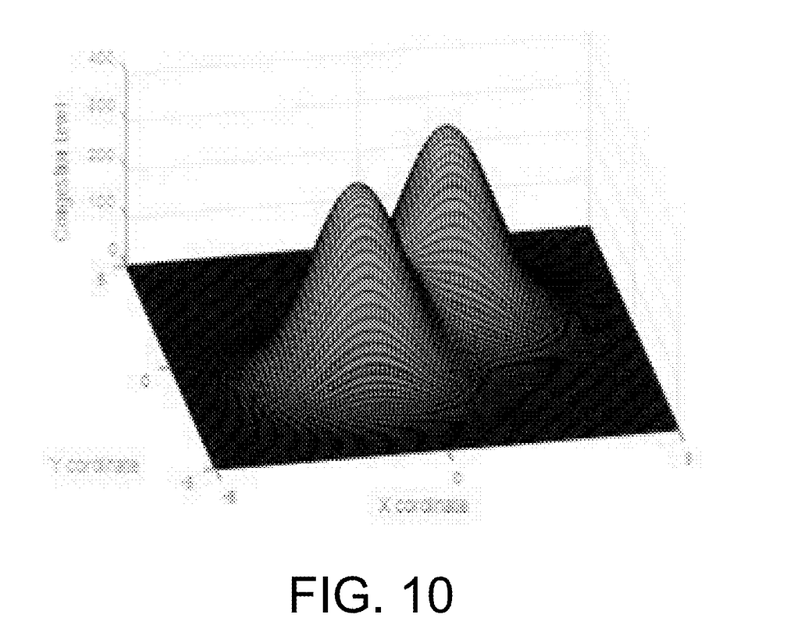
FIG. 10 is a three-dimensional graph showing the representation of the two adjacent hotspots in FIG. 9 using the modified Gaussian kernel function.

FIG. 9 shows a graphical representation of two interconnection congestion hotspots. These are modeled using a modified Gaussian kernel function, which represents the hotspots as shown in FIG. 10. It is clear from the representations of the hotspots in FIGS. 9 and 10 that a region between the hotspots can be affected by both hotspots, thereby making the region more difficult to route than the ACE metric would otherwise indicate. A proximity penalty can be computed based on the modified Gaussian kernel function using the equation discussed above with reference to step 610 in FIG. 6. The proximity penalty is a number greater than one. The congestion table is updated by multiplying an ACE value by a corresponding proximity penalty, resulting in values in the congestion table that more accurately predict routability.

Figure 11:
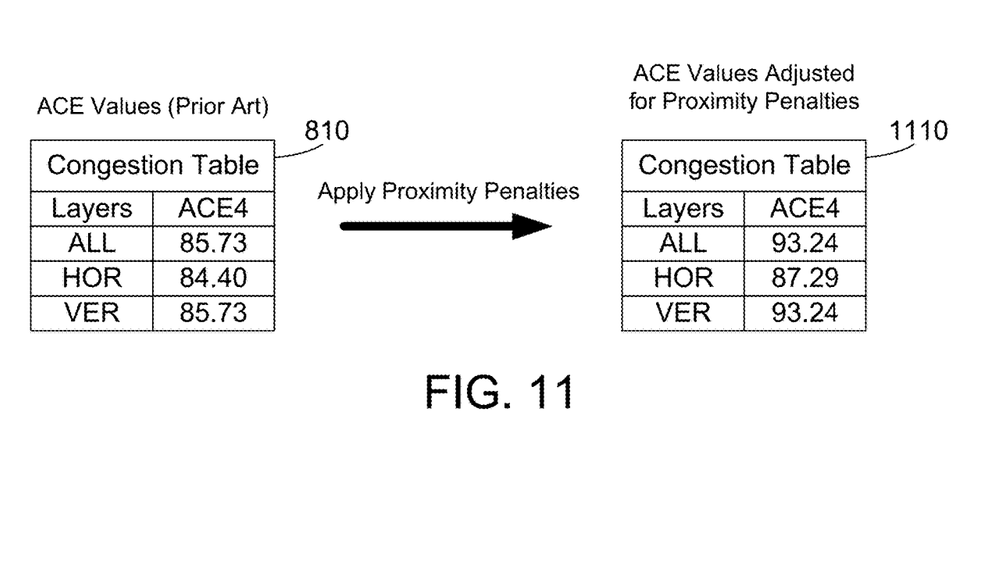
FIG. 11 is a block diagram showing values in a congestion table that were generated in the prior art to predict routability of interconnect congestion hotspots, and how these values are updated according to proximity penalties when two hotspots are in proximity to each other, thereby changing the prediction of routability of interconnection congestion hotspots to more accurately reflect challenges that will likely be faced during actual routing of the integrated circuit physical design.

FIG. 11 shows a small part of prior art congestion table 810 shown in FIG. 8, showing the three ACE4 values for ALL, HOR and VER. We assume all of the ACE values in the congestion table 810 in FIG. 8 are updated by multiplying these values times a corresponding proximity penalty that is computed using the equation discussed above with reference to step 610 in FIG. 6. As shown in FIG. 11, multiplying these values in prior art congestion table 810 by the corresponding proximity penalties results in an updated congestion table 1110 as shown, which includes values of 93.24 for ALL, 87.29 for HOR and 93.24 for VER. FIG. 11 graphically illustrates the problem with the prior art ACE metric. Because the prior art ACE metric does not account for proximity of interconnection congestion hotspots, the values in congestion table 810 will result in a prediction that all interconnection congestion hotspots are routable, while the updated congestion table 1110 according to the preferred embodiments will result in a prediction that ALL and VER are unroutable. By taking into account the proximity of interconnection congestion hotspots to each other, the integrated circuit physical design tool disclosed and claimed herein more accurately predicts routability of interconnections prior to actually routing the interconnections in the integrated circuit physical design.

Figure 12:
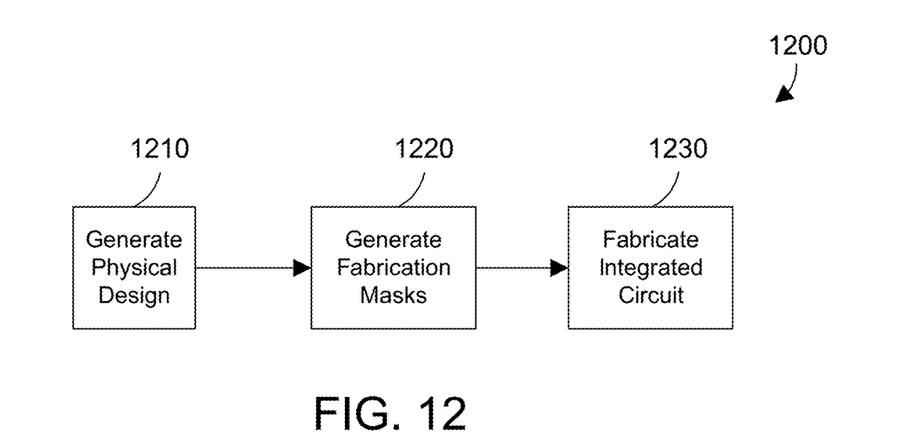
FIG. 12 is a block diagram showing how the physical design, once generated, is used to generate fabrication masks, which are then used to fabricate an integrated circuit.

Referring back to FIG. 3, once the values in the updated congestion table predict all interconnection congestion hotspots are routable (step 330=YES), the interconnections are routed (step 340). The generation of the physical design continues until the integrated circuit physical design 170 is complete, as shown in FIG. 1. Referring now to FIG. 12, a method 1200 shows how the integrated circuit physical design is used to generate an integrated circuit. The physical design is generated in step 1210, with the result being a completed integrated circuit physical design 170 as shown in FIG. 1. Fabrication masks are then generated (step 1220), and the integrated circuit can then be fabricated (step 1230). Method 1200 is an extremely simplified flow showing the steps in fabricating an integrated circuit from a physical design.

The disclosure and claims herein support an apparatus comprising: at least one processor; a memory coupled to the at least one processor; and an integrated circuit physical design tool residing in the memory and executed by the at least one processor, wherein the integrated circuit physical design tool places a plurality of components in an integrated circuit physical design, builds a congestion table based on computed congestion values for interconnections between the plurality of components, identifies from the congestion table a plurality of interconnection congestion hotspots, determines proximity of the plurality of interconnection congestion hotspots to each other, computes a plurality of penalization values based on the proximity of the plurality of interconnection congestion hotspots to each other, updates the congestion table to reflect the plurality of penalization values, and predicts based on the updated congestion table routability of interconnections in the plurality of interconnection congestion hotspots before routing the plurality of interconnections between the plurality of components.

The disclosure and claims herein further support a computer-implemented method executed by at least one processor for generating an integrated circuit physical design, the method comprising: placing a plurality of components in the integrated circuit physical design; building a congestion table based on computed congestion values for interconnections between the plurality of components; identifying from the congestion table a plurality of interconnection congestion hotspots; determining proximity of the plurality of interconnection congestion hotspots to each other; computing a plurality of penalization values based on the proximity of the plurality of interconnection congestion hotspots to each other; updating the congestion table to reflect the plurality of penalization values; and predicting based on the updated congestion table routability of interconnections in the plurality of interconnection congestion hotspots before routing the plurality of interconnections between the plurality of components.

The disclosure and claims herein additionally support a computer-implemented method executed by at least one processor for fabricating an integrated circuit, the method comprising: placing a plurality of components in an integrated circuit physical design; building a congestion table based on computed congestion values for interconnections between the plurality of components; identifying from the congestion table a plurality of interconnection congestion hotspots; determining proximity of the plurality of interconnection congestion hotspots to each other; computing a plurality of penalization values based on the proximity of the plurality of interconnection congestion hotspots to each other, wherein penalization values for first and second of the plurality of hotspots are computed using the equation:

$$ProximityPenalty = 1 + \beta * e^{\left(-\frac{\sqrt{(y_2-y_1)^2+(x_2-x_1)^2}}{\sqrt{S_1}+\sqrt{S_2}}\right)}$$

where: (x1,y1) are cartesian coordinates for the first of the plurality of interconnection congestion hotspots;
(x2,y2) are cartesian coordinates for the second of the plurality of interconnection congestion hotspots;
S1 is the size of the first of the plurality of interconnection congestion hotspots;
S2 is the size of the second of the plurality of interconnection congestion hotspots; and
β is a tunable value selected according to the technology used to fabricate the integrated circuit physical design;
updating the congestion table to reflect the plurality of penalization values by multiplying each of the computed congestion values for interconnections in the congestion table by a corresponding one of the plurality of penalization values; predicting based on the updated congestion table routability of interconnections in the plurality of interconnection congestion hotspots before routing the plurality of interconnections between the plurality of components, when predicting based on the updated congestion table the routability of interconnections in the plurality of interconnection hotspots predicts that all interconnections in the plurality of interconnection congestion hotspots are routable, routing of the plurality of interconnections between the plurality of components in the integrated circuit physical design.

An integrated circuit physical design tool includes an interconnection congestion predictor that generates a congestion table for an integrated circuit design. Interconnection congestion hotspots are identified based on the congestion table. The proximity of interconnection congestion hotspots to each other is determined, and penalization values are computed based on the proximity of interconnection congestion hotspots to each other. The congestion table is then updated to reflect the penalization values due to proximity of interconnection congestion hotspots. Routability of the interconnection congestion hotspots is then predicted based on the updated congestion table. The updated congestion table may also be used by multiple physical design optimization tools, including placement, global routing, and detail routing.

One skilled in the art will appreciate that many variations are possible within the scope of the claims. Thus, while the disclosure is particularly shown and described above, it will be understood by those skilled in the art that these and other changes in form and details may be made therein without departing from the spirit and scope of the claims.

The invention claimed is:
1. An apparatus comprising:
   at least one processor;
   a memory coupled to the at least one processor; and
   an integrated circuit physical design tool residing in the memory and executed by the at least one processor, wherein the integrated circuit physical design tool places a plurality of components in an integrated circuit physical design, builds a congestion table based on computed congestion values for interconnections between the plurality of components, wherein the computed congestion values are based on a metric known as Average Congestion of the x % most congested Edges (ACE), identifies from the congestion table a plurality of interconnection congestion hotspots, determines proximity of the plurality of interconnection congestion hotspots to each other, computes a plurality of penalization values based on the proximity of the plurality of interconnection congestion hotspots to each other, updates the congestion table to reflect the plurality of penalization values, and predicts based on the updated congestion table routability of interconnections in the plurality of interconnection congestion hotspots before routing the plurality of interconnections between the plurality of components.

2. The apparatus of claim 1 wherein, when the integrated circuit physical design tool predicts that all interconnections in the plurality of interconnection congestion hotspots are routable, the integrated circuit physical design tool performs routing of the plurality of interconnections between the plurality of components in the integrated circuit physical design.

3. The apparatus of claim 1 wherein the plurality of penalization values are computed by representing each of the plurality of interconnection congestion hotspots as a modified Gaussian kernel function.

4. The apparatus of claim 1 wherein penalization values for first and second of the plurality of hotspots are computed using the equation:

$$ProximityPenalty = 1 + \beta * e^{\left(-\frac{\sqrt{(y_2-y_1)^2+(x_2-x_1)^2}}{\sqrt{s_1}+\sqrt{s_2}}\right)}$$

where: (x1,y1) are cartesian coordinates for the first of the plurality of interconnection congestion hotspots;
   (x2,y2) are cartesian coordinates for the second of the plurality of interconnection congestion hotspots;
   S1 is the size of the first of the plurality of interconnection congestion hotspots;
   S2 is the size of the second of the plurality of interconnection congestion hotspots; and
   β is a tunable value that controls the proximity penalty range.

5. The apparatus of claim 4 wherein the value of β is selected according to the technology used to fabricate the integrated circuit physical design.

6. The apparatus of claim 5 wherein the value of β is from 0.3 to 0.5 for twenty nanometer or greater technology.

7. The apparatus of claim 5 wherein the value of β is from 0.8 to 1.0 for 10-14 nanometer technology.

8. The apparatus of claim 5 wherein the value of β is from 1.0 to 2.0 for less than 7 nanometer technology.

9. The apparatus of claim 1 wherein the plurality of penalization values are each greater than or equal to one, wherein updating the congestion table to reflect the plurality of penalization values comprises multiplying each of the computed congestion values for interconnections in the congestion table by a corresponding one of the plurality of penalization values.

10. A computer-implemented method executed by at least one processor for generating an integrated circuit physical design, the method comprising:
   placing a plurality of components in the integrated circuit physical design;
   building a congestion table based on computed congestion values for interconnections between the plurality of components, wherein the computed congestion values are based on a metric known as Average Congestion of the x % most congested Edges (ACE);
   identifying from the congestion table a plurality of interconnection congestion hotspots;
   determining proximity of the plurality of interconnection congestion hotspots to each other;
   computing a plurality of penalization values based on the proximity of the plurality of interconnection congestion hotspots to each other;
   updating the congestion table to reflect the plurality of penalization values; and
   predicting based on the updated congestion table routability of interconnections in the plurality of interconnection congestion hotspots before routing the plurality of interconnections between the plurality of components.

11. The method of claim 10 wherein, when predicting based on the updated congestion table the routability of interconnections in the plurality of interconnection hotspots predicts that all interconnections in the plurality of interconnection congestion hotspots are routable, routing of the plurality of interconnections between the plurality of components in the integrated circuit physical design.

12. The method of claim 10 wherein the plurality of penalization values are computed by representing each of the plurality of interconnection congestion hotspots as a modified Gaussian kernel function.

13. The method of claim 10 wherein penalization values for first and second of the plurality of hotspots are computed using the equation:

$$ProximityPenalty = 1 + \beta * e^{\left(-\frac{\sqrt{(y_2-y_1)^2+(x_2-x_1)^2}}{\sqrt{s_1}+\sqrt{s_2}}\right)}$$

where: (x1,y1) are cartesian coordinates for the first of the plurality of interconnection congestion hotspots;
   (x2,y2) are cartesian coordinates for the second of the plurality of interconnection congestion hotspots;
   S1 is the size of the first of the plurality of interconnection congestion hotspots;
   S2 is the size of the second of the plurality of interconnection congestion hotspots; and
   β is a tunable value that controls the proximity penalty range.

14. The method of claim 13 wherein the value of β is selected according to the technology used to fabricate the integrated circuit physical design.

15. The method of claim 14 wherein the value of β is from 0.3 to 0.5 for twenty nanometer or greater technology.

16. The method of claim 14 wherein the value of β is from 0.8 to 1.0 for 10-14 nanometer technology.

17. The method of claim 14 wherein the value of β is from 1.0 to 2.0 for less than 7 nanometer technology.

18. The method of claim 10 wherein the plurality of penalization values are each greater than or equal to one, wherein updating the congestion table to reflect the plurality of penalization values comprises multiplying each of the computed congestion values for interconnections in the congestion table by a corresponding one of the plurality of penalization values.

19. A computer-implemented method executed by at least one processor for fabricating an integrated circuit, the method comprising:
- placing a plurality of components in an integrated circuit physical design;
- building a congestion table based on computed congestion values for interconnections between the plurality of components;
- identifying from the congestion table a plurality of interconnection congestion hotspots;
- determining proximity of the plurality of interconnection congestion hotspots to each other;
- computing a plurality of penalization values based on the proximity of the plurality of interconnection congestion hotspots to each other, wherein penalization values for first and second of the plurality of hotspots are computed using the equation:

$$ProximityPenalty = 1 + \beta * e^{\left(-\frac{\sqrt{(y_2-y_1)^2+(x_2-x_1)^2}}{\sqrt{s_1}+\sqrt{s_2}}\right)}$$

where: (x1,y1) are cartesian coordinates for the first of the plurality of interconnection congestion hotspots;
- (x2,y2) are cartesian coordinates for the second of the plurality of interconnection congestion hotspots;
- S1 is the size of the first of the plurality of interconnection congestion hotspots;
- S2 is the size of the second of the plurality of interconnection congestion hotspots; and
- β is a tunable value selected according to the technology used to fabricate the integrated circuit physical design;
- updating the congestion table to reflect the plurality of penalization values by multiplying each of the computed congestion values for interconnections in the congestion table by a corresponding one of the plurality of penalization values;
- predicting based on the updated congestion table routability of interconnections in the plurality of interconnection congestion hotspots before routing the plurality of interconnections between the plurality of components, when predicting based on the updated congestion table the routability of interconnections in the plurality of interconnection hotspots predicts that all interconnections in the plurality of interconnection congestion hotspots are routable, routing of the plurality of interconnections between the plurality of components in the integrated circuit physical design.

20. The method of claim 19 further comprising:
after routing of the plurality of interconnections between the plurality of components in the integrated circuit physical design:
- generating a plurality of fabrication masks for the integrated circuit physical design; and
- fabricating using the plurality of fabrication masks an integrated circuit that includes the integrated circuit physical design.

* * * * *